US011257868B2

(12) United States Patent
Xiao et al.

(10) Patent No.: US 11,257,868 B2
(45) Date of Patent: Feb. 22, 2022

(54) DISPLAY SUBSTRATE, FABRICATING METHOD THEREOF AND DISPLAY DEVICE

(71) Applicant: BOE TECHNOLOGY GROUP CO., LTD., Beijing (CN)

(72) Inventors: Zhihui Xiao, Beijing (CN); Yu Feng, Beijing (CN); Ge Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 42 days.

(21) Appl. No.: 16/451,136

(22) Filed: Jun. 25, 2019

(65) Prior Publication Data

US 2020/0075688 A1     Mar. 5, 2020

(30) Foreign Application Priority Data

Sep. 4, 2018    (CN) .......................... 201811027575.7

(51) Int. Cl.
*H01L 27/32*     (2006.01)
*H01L 51/52*     (2006.01)
*H01L 51/56*     (2006.01)

(52) U.S. Cl.
CPC ...... *H01L 27/3216* (2013.01); *H01L 27/3227* (2013.01); *H01L 27/3258* (2013.01); *H01L 51/5203* (2013.01); *H01L 51/56* (2013.01)

(58) Field of Classification Search
CPC ............. H01L 27/3216; H01L 51/5203; H01L 27/3227; H01L 27/3234; H01L 27/3258; H01L 51/56; H01L 51/525; H01L 27/326; H01L 27/32; H01L 27/3244
See application file for complete search history.

(56) References Cited

U.S. PATENT DOCUMENTS

| | | | |
|---|---|---|---|
| 10,644,077 B1* | 5/2020 | Choi .................... G09G 3/3233 |
| 10,705,641 B2* | 7/2020 | Liu .................... H01L 29/41775 |
| 10,817,696 B2* | 10/2020 | Yoshii .................... G06F 3/0421 |
| 2015/0187830 A1* | 7/2015 | Dai .................... G02F 1/13306 |
| | | | 257/53 |
| 2019/0079628 A1* | 3/2019 | Liu .................... G06F 3/04144 |
| 2019/0237521 A1* | 8/2019 | Ju .................... H01L 51/5281 |
| 2019/0245011 A1* | 8/2019 | Lius .................... H01L 27/3272 |
| 2019/0259326 A1* | 8/2019 | Baumheinrich .... H01L 27/3244 |
| 2020/0227508 A1* | 7/2020 | Kim .................... G09G 3/3233 |

* cited by examiner

*Primary Examiner* — Bilkis Jahan
*Assistant Examiner* — Victor V Barzykin
(74) *Attorney, Agent, or Firm* — Calfee, Halter & Griswold LLP

(57) ABSTRACT

A display substrate includes: a base substrate including a photosensitive region, the photosensitive region including a plurality of display regions spaced apart and a gap region between the plurality of display regions; a first electrode layer on the base substrate; a light-emitting layer on a side of the first electrode layer away from the base substrate; and a second electrode layer on a side of the light-emitting layer away from the base substrate. Each display region corresponds to at least one first luminescent material region of the light-emitting layer; the gap region corresponds to the plurality of second luminescent material regions of the light-emitting layer; a part of the second electrode layer in the photosensitive region includes a plurality of second electrodes spaced apart, and an orthographic projection of each second electrode on the base substrate overlaps with each display region.

19 Claims, 6 Drawing Sheets

DISPLAY SUBSTRATE, FABRICATING METHOD THEREOF AND DISPLAY DEVICE

RELATED APPLICATION

The present application claims the benefit of Chinese Patent Application No. 201811027575.7, filed on Sep. 4, 2018, the entire disclosures of which are incorporated herein by reference.

TECHNICAL FIELD

The present disclosure relates to the display technology, in particular to a display substrate, a fabricating method thereof and a display device.

BACKGROUND

A full screen display device refers to a display device with a screen-to-body ratio of approximately 100%. In order to effectively increase the screen-to-body ratio of the display device, sensors (such as a camera, an infrared sensor, and a light intensity sensor) are usually disposed below the display substrate in the display device. Meanwhile, in order to achieve normal photosensitive function for various types of sensors in the display device, it is necessary to arrange a region of the display substrate where the sensors are located as a region capable of transmitting light.

In a related art, a display substrate in a display device includes an anode disposed on a base substrate, an organic material layer disposed on a side of the anode away from the base substrate, and a cathode disposed on a side of the organic material layer away from the base substrate. The cathode, as a whole layer, covers the organic material layer.

However, since the transmittance of the cathode is generally only 50%, the transmittance of the photosensitive region in the display substrate is low, resulting in a poor photosensitive effect of the sensor below the display substrate.

SUMMARY

According to an embodiment of the present disclosure, a display substrate is provided. The display substrate includes: a base substrate including a photosensitive region, the photosensitive region including a plurality of display regions spaced apart and a gap region between the plurality of display regions; a first electrode layer on the base substrate; a light-emitting layer on a side of the first electrode layer away from the base substrate; and a second electrode layer on a side of the light-emitting layer away from the base substrate. The light-emitting layer includes a plurality of first luminescent material regions and a plurality of second luminescent material regions; each display region corresponds to at least one first luminescent material region; the gap region corresponds to the plurality of second luminescent material regions; a part of the second electrode layer in the photosensitive region includes a plurality of second electrodes spaced apart, and an orthographic projection of each second electrode on the base substrate overlaps with each display region.

In some embodiments, the display substrate further includes a plurality of third electrodes in the plurality of display regions. A top of each third electrode is higher than a top of the light-emitting layer in a direction perpendicular to the base substrate, and each second electrode is in connection with a part of each third electrode higher than the light-emitting layer.

In some embodiments, the display substrate further includes a plurality of support posts in the plurality of display regions. The plurality of support posts are in one-to-one correspondence with the plurality of third electrodes, and each third electrode covers a top surface and a side surface of a corresponding one of the plurality of support posts.

In some embodiments, each support post is a cylinder or a polygonal prism.

In some embodiments, each support post is a truncated cone or a truncated pyramid, and an angle between a side surface and a bottom surface of each support post ranges from 5 degrees to 85 degrees.

In some embodiments, the display substrate further includes a planarization layer between the base substrate and the first electrode layer. The plurality of support posts and the planarization layer are integrated.

In some embodiments, the display substrate further includes a non-photosensitive region. A part of the light-emitting layer in the non-photosensitive region includes a plurality of third luminescent material regions, and a part of the second electrode layer in the non-photosensitive region includes a sheet electrode. An orthographic projection of the sheet electrode on the base substrate covers orthographic projections of the plurality of third luminescent material regions on the base substrate.

In some embodiments, a size of each first luminescent material region in the display region is smaller than a size of each third luminescent material region in the non-photosensitive region.

According to another embodiment of the present disclosure, a method for fabricating a display substrate of the first aspect is provided. The method includes: providing a base substrate including a photosensitive region, the photosensitive region including a plurality of display regions spaced apart and a gap region between the plurality of display regions; forming a first electrode layer on the base substrate; forming a light-emitting layer on a side of the first electrode layer away from the base substrate; and forming a second electrode layer on a side of the light-emitting layer away from the base substrate. The light-emitting layer includes a plurality of first luminescent material regions and a plurality of second luminescent material regions; each display region corresponds to at least one first luminescent material region; the gap region corresponds to the plurality of second luminescent material region; a part of the second electrode layer in the photosensitive region includes a plurality of second electrodes spaced apart, and an orthographic projection of each second electrode on the base substrate overlaps with each display region.

In some embodiments, the method further includes forming a plurality of third electrodes in the plurality of display regions before forming the light-emitting layer on the side of the first electrode layer away from the base substrate. A top of each third electrode is higher than a top of the light-emitting layer in a direction perpendicular to the base substrate, and each second electrode is in connection with a part of each third electrode higher than the light-emitting layer.

In some embodiments, the method further includes forming a plurality of support posts before forming the first electrode layer on the base substrate, the plurality of support posts being in one-to-one correspondence with the plurality of third electrodes. The step of forming the plurality of third electrodes in the plurality of display regions includes: forming each of the plurality of third electrodes on a top surface and a side surface of each of the plurality of support posts.

According to another embodiment of the present disclosure, a display device is provided. The display device includes a display substrate of the first aspect; the display substrate includes: a base substrate including a photosensitive region, the photosensitive region including a plurality of display regions spaced apart and a gap region between the plurality of display regions; a first electrode layer on the base substrate; a light-emitting layer on a side of the first electrode layer away from the base substrate; and a second electrode layer on a side of a light-emitting layer away from the base substrate. The light-emitting layer includes a plurality of first luminescent material regions and a plurality of second luminescent material regions; each display region corresponds to at least one first luminescent material region; the gap region corresponds to the plurality of second luminescent material regions; a part of the second electrode layer in the photosensitive region includes a plurality of second electrodes spaced apart, and an orthographic projection of each second electrode on the base substrate overlaps with each display region.

In some embodiments, the display device further includes a plurality of third electrodes in the plurality of display regions. A top of each third electrode is higher than a top of the light-emitting layer in a direction perpendicular to the base substrate, and each second electrode is in connection with a part of each third electrode higher than the light-emitting layer.

In some embodiments, the display device further includes a plurality of support posts in the plurality of display regions. The plurality of support posts are in one-to-one correspondence with the plurality of third electrodes, and each third electrode covers a top surface and a side surface of a corresponding one of the plurality of support posts.

In some embodiments, each support post is a cylinder or a polygonal prism.

In some embodiments, each support post is a truncated cone or a truncated pyramid, and an angle between a side surface and a bottom surface of each support post ranges from 5 degrees to 85 degrees.

In some embodiments, the display device further includes a planarization layer between the base substrate and the first electrode layer. The plurality of support posts and the planarization layer are integrated.

In some embodiments, the display device further includes a non-photosensitive region. A part of the light-emitting layer in the non-photosensitive region includes a plurality of third luminescent material regions, and a part of the second electrode layer in the non-photosensitive region includes a sheet electrode. An orthographic projection of the sheet electrode on the base substrate covers orthographic projections of the plurality of third luminescent material regions on the base substrate.

In some embodiments, a size of each first luminescent material region in the display region is smaller than a size of each third luminescent material region in the non-photosensitive region.

In some embodiments, the display device further includes an optical sensor on a side of the base substrate that faces away from the light-emitting layer. The optical sensor corresponds to the photosensitive region.

BRIEF DESCRIPTION OF THE DRAWINGS

In order to more clearly illustrate the technical solutions in embodiments of the disclosure or in the prior art, the appended drawings needed to be used in the description of the embodiments will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

To make the object, technical solutions and advantages apparent, the embodiments of the present disclosure will be further described in detail below with reference to the accompanying drawings.

Figure 1:
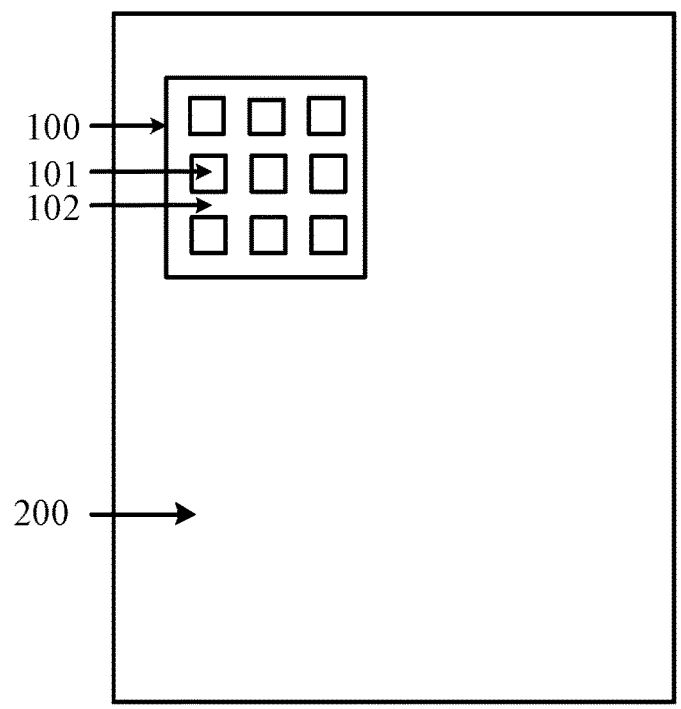
FIG. 1 is a schematic top view of a display substrate according to an embodiment of the present disclosure.

FIG. 1 is a schematic top view of a display substrate according to an embodiment of the present disclosure. As shown in FIG. 1, the display substrate may include a photosensitive region 100 and a non-photosensitive region 200, and the photosensitive region may be a region for a sensor to sense light. The photosensitive region 100 includes a plurality of display regions 101 spaced apart and a gap region 102 between the plurality of display regions 101. As shown in FIG. 1, the gap region 102 may be a grid region having a plurality of openings corresponding to the plurality of display regions 101.

The term "display region" as used in the present disclosure refers to a region that can be used for display in the photosensitive region 100, as opposed to a gap region that cannot be used for display. It should be understood that the entire non-photosensitive region 200 of the display substrate can be used for display.

Figure 2:
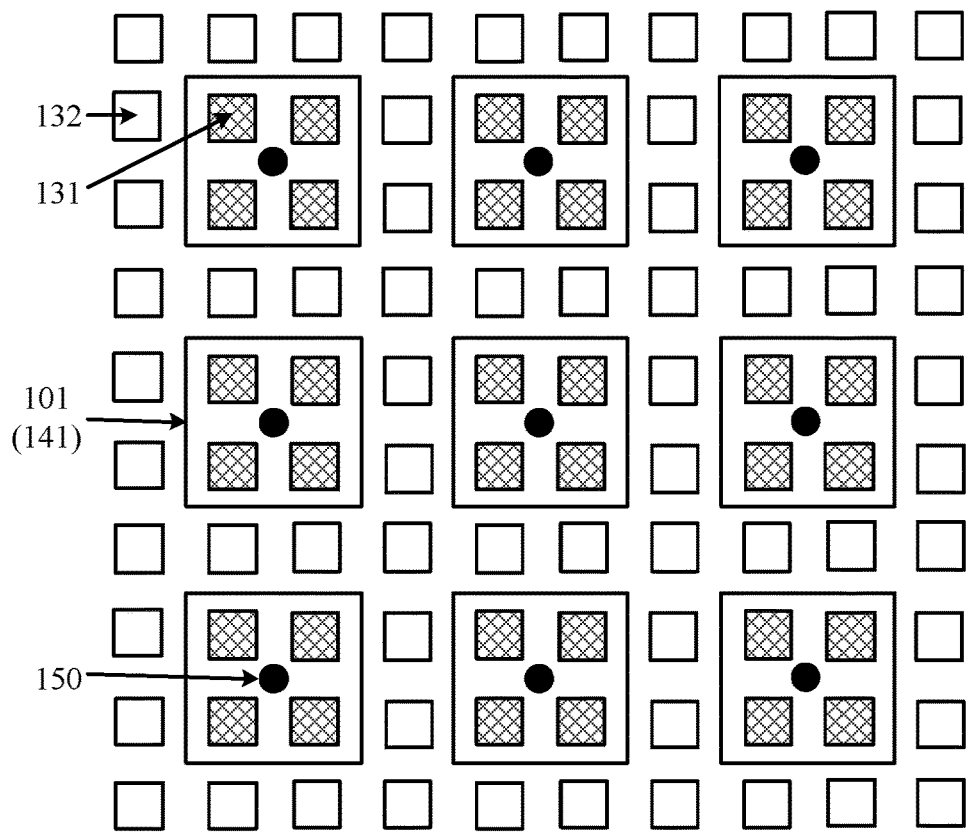
FIG. 2 is a schematic top view of a photosensitive region of a display substrate according to an embodiment of the present disclosure.
Figure 3:
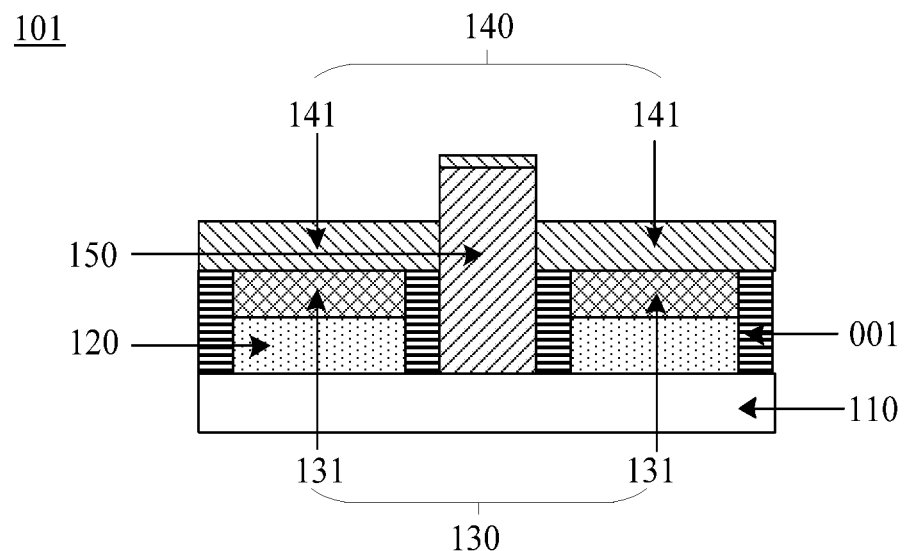
FIG. 3 is a schematic cross-sectional view of a display region of a display substrate according to an embodiment of the present disclosure.

FIG. 2 is a schematic top view of a photosensitive region 100 of a display substrate according to an embodiment of the present disclosure, and FIG. 3 is a schematic cross-sectional view of a display region 101 of the display substrate according to an embodiment of the present disclosure. As shown in FIG. 2 and FIG. 3, the display substrate may include a base substrate 110, a first electrode layer 120 on the base substrate 110, a light-emitting layer 130 on a side of the first electrode layer 120 away from the base substrate 110, and a second electrode layer 140 on a side of the light-emitting layer 130 away from the base substrate 110. The light-emitting layer 130 includes a plurality of first luminescent material regions 131 and a plurality of second luminescent material regions 132; each display region 101 corresponds to at least one first luminescent material region 131; the gap region 102 corresponds to the plurality of second luminescent material regions 132; a part of the second electrode layer 140 in the photosensitive region 100 includes a plurality of second electrodes 141 spaced apart, and an orthographic projection of each second electrode 141 on the base substrate overlaps with each display region 101. The first electrode layer 120 may be made of an indium tin oxide (ITO) material, and the first electrode layer 120 may be an anode. The plurality of second electrodes 141 may be made of a material such as ITO or silver, and each second electrode may be a cathode. The light-emitting layer 130 may be made of an organic luminescent material. In the embodiment of the present disclosure, as shown in FIG. 3, the plurality of first luminescent material regions 131 are formed in regions defined by the pixel defining layer 001.

Figure 4:
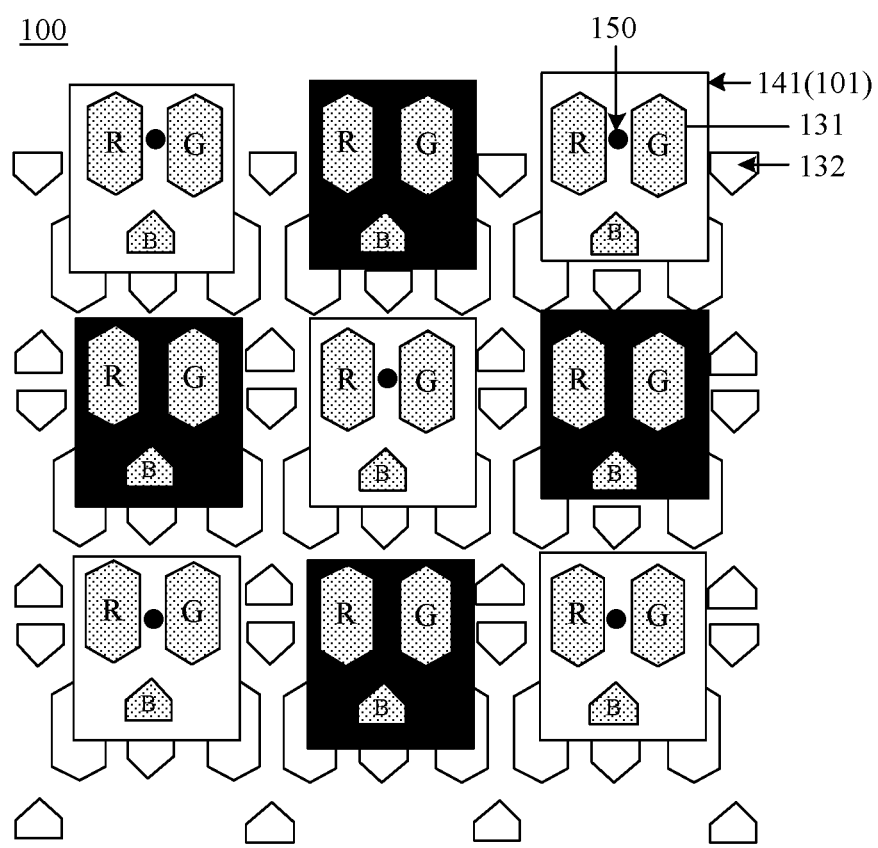
FIG. 4 is a schematic top view of a photosensitive region of a display substrate according to an embodiment of the present disclosure.

FIG. 4 shows a top view of a photosensitive region 100 of a display substrate according to an embodiment of the present disclosure. The second luminescent material region 132 may be completely located in the gap region 102 (as shown in FIG. 2), or may be partially located in the display region 101 (as shown in FIG. 4), and it should be understood that the specific shapes and distributions of the first luminescent material regions 131 and the second luminescent material regions 132 shown in the drawings are only illustrative, and the disclosure does not limit in this regard. Specifically, as shown in FIG. 4, the plurality of first luminescent material regions 131 may include red emitting regions R, green emitting regions G, and blue emitting regions B. The gap region may be provided with a plurality of second luminescent material regions 132, or the second luminescent material region 132 may not be provided. The plurality of second electrodes may be connected to a driving circuit (not shown) through vias or the like to drive the at least one first luminescent material region in the display region to emit light normally.

A sensor may be disposed on a side of the base substrate facing away from the light-emitting layer, and an orthographic projection of the sensor on the base substrate 110 may be located in the photosensitive region. For example, the sensor may be a camera or an infrared sensor.

In summary, embodiments of the present disclosure provide a display substrate, the display substrate includes a base substrate, a first electrode layer, a light-emitting layer, and a second electrode layer which are arranged in this order. In a photosensitive region of the display substrate, the second electrode layer includes a plurality of second electrodes spaced apart, and there is a gap region between the plurality of second electrodes. There is no second electrode in the gap region, so that light transmittance of the photosensitive region can be improved, thereby improving the photosensitive effect of the sensor.

In some embodiments, the plurality of second electrodes can be connected to the drive circuitry by providing additional electrodes. In this case, as shown in FIGS. 2-4, the display substrate may include a plurality of third electrodes 150 in the plurality of display regions 101. As shown in FIG. 3, a top of each third electrode 150 is higher than a top of the light-emitting layer 130 in a direction perpendicular to the base substrate 110, and each second electrode 140 is in connection with a part of each third electrode 150 higher than the light-emitting layer. The plurality of third electrodes and the first electrode layer may be formed by one patterning process. Alternatively, the first electrode layer and the plurality of third electrodes may be formed on the base substrate by different patterning processes. The plurality of third electrodes may be made of a material such as ITO or silver.

The third electrode 150 can transmit a power signal provided by the driving circuit to the corresponding second electrode 141. Then the second electrode 141, together with the first electrode layer 120, can drive the first luminescent material region 131 to emit light.

Figure 5:
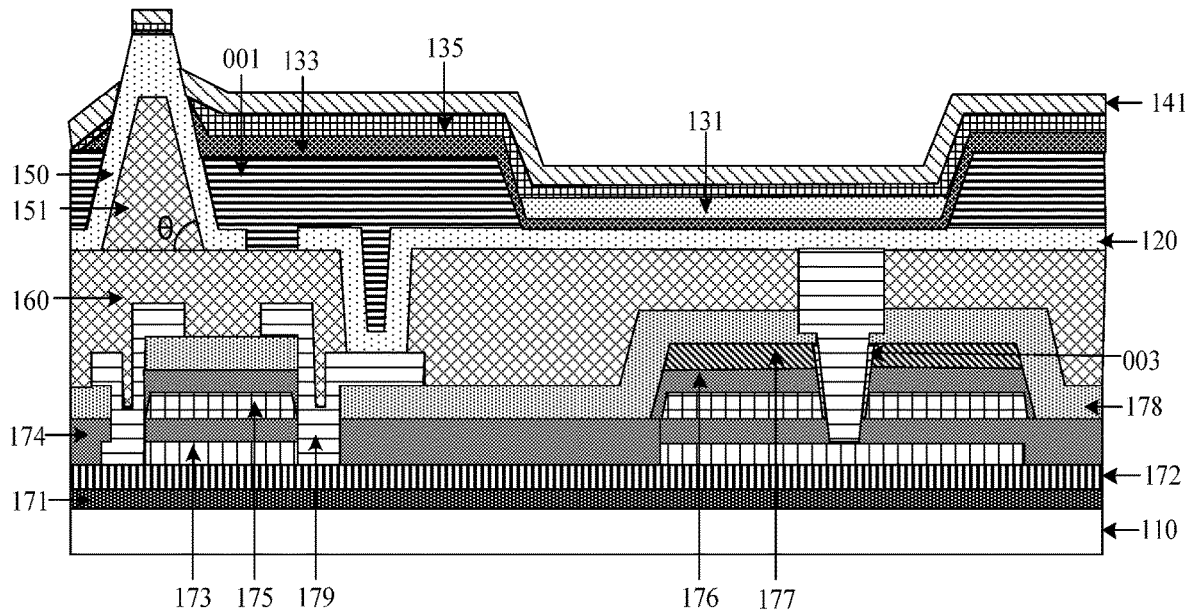
FIG. 5 is a schematic cross-sectional view of a display region of a display substrate according to an embodiment of the present disclosure.

FIG. 5 is a schematic cross-sectional view of a display region 101 according to an embodiment of the present disclosure. Referring to FIG. 5, the display substrate may further include a plurality of support posts 151 in the plurality of display regions. The plurality of support posts 151 are in one-to-one correspondence with the plurality of third electrodes 150, and each third electrode 150 covers a top surface and a side surface of a corresponding one of the plurality of support posts 151. Only one support post 151 and one third electrode 150 in the display region 101 of the base substrate are shown schematically in FIG. 5.

Optionally, an electron transport layer 135 may be disposed on a side of the light-emitting layer 130 away from the base substrate 110, and a hole transport layer 133 is disposed on a side of the light-emitting layer 130 adjacent to the base substrate. In the process of fabricating the display substrate, the electron transport layer 135, the hole transport layer 133, and the second electrode layer 140 may cover the top surface of the third electrode 150 and a part of the side surface of the third electrode 150. The electron transport layer 135 and the hole transport layer 133 may be made of an organic material.

In the embodiment of the present disclosure, as shown in FIG. 5, a planarization layer 160 may be disposed between the base substrate 110 and the first electrode layer 120, and the support posts 151 and the planarization layer 160 may be integrated. In the process of fabricating the display substrate, the plurality of support posts 151 and the planarization layer 160 may be formed by one patterning process. Alternatively, the planarization layer 160 may be formed on the base substrate 110 first, and then the plurality of support posts 151 may be formed on a side of the planarization layer 160 away from the base substrate 110. Optionally, the plurality of support posts 151 and the planarization layer 160 may be made of a resin material.

Optionally, each support post may be a cylinder or a polygonal prism, such as a quadrangular prism, a hexagonal prism, or an octagonal prism.

Optionally, each support post may be a truncated cone or a truncated pyramid. For example, as shown in FIG. 5, an angle θ between a side surface of the support post 151 and a side of the planarization layer 160 away from the base substrate 110 may be an acute angle. For example, the angle θ can range from 5 degrees to 85 degrees. In this case, a part of the third electrode 150 covering the side surface of the support post 151 is also at an angle θ with the planarization layer 160, so that the contact region between the third electrode 150 and the second electrode 141 can be increased, which facilitates a formation of a better electrical connection.

In the related art, in a process of evaporating the light-emitting layer 130 with a mask, since a distance between the mask and the light-emitting layer 130 is relatively small, the light-emitting layer 130 may be damaged. In embodiments of the present disclosure, the plurality of support posts can support a package glass, so original support structures in the display substrate can be omitted. Meanwhile, since the plurality of support posts are higher than the light-emitting layer 130, in the process of evaporating the light-emitting layer 130 with a mask, the distance between the mask and the light-emitting layer 130 will not be too small, and damage to the light-emitting layer 130 of the display substrate during the mask evaporation can be avoided.

Optionally, a part of the light-emitting layer in the non-photosensitive region may include a plurality of third luminescent material regions, and an area of each first luminescent material region in the display region of the photosensitive region is smaller than an area of each third luminescent material region in the non-photosensitive region. Since the gap between the plurality of first luminescent material regions in the display region of the photosensitive region is large, the transmittance of the photosensitive region of the display substrate is further improved. In an embodiment of the present disclosure, a part of the second electrode layer 140 in the non-photosensitive region may include a sheet electrode, and an orthographic projection of the sheet electrode on the base substrate covers orthographic projections of the plurality of third luminescent material regions on the base substrate. The sheet electrode, together with and the first electrode layer 120 in the non-photosensitive region, drive the third luminescent material regions in the non-photosensitive region to emit light.

In the embodiment of the present disclosure, as shown in FIG. 5, the display substrate may further include a polyimide (PI) film 171, a buffer layer 172, an active layer 173, a first insulating layer 174, a first gate layer 175, a second insulating layer 176, a second gate layer 177, a interlayer dielectric layer 178, and a source/drain layers 179 which are arranged on the base substrate 110 in this order. The second gate layer 177 can be connected to the source/drain layer 179 through a via 003. The source/drain layer 179 may be connected to the active layer 173 through the via 003.

In summary, embodiments of the present disclosure provide a display substrate, the display substrate includes a base substrate, a first electrode layer, a light-emitting layer, and a second electrode layer which are arranged in this order. In a photosensitive region of the display substrate, the second electrode layer includes a plurality of second electrodes spaced apart, each second electrode is in connection with a side surface of a part of each third electrode higher than the light-emitting layer, thus a power signal provided by a driving circuit can be transmitted to the corresponding second electrode through the third electrode. Then the second electrode, together with the first electrode layer, can drive the first luminescent material region to emit light. The display substrate provided by the embodiments of the present disclosure can transmit the power signal to the plurality of second electrodes spaced apart through the plurality of third electrodes, ensuring the plurality of first luminescent material regions can be normally driven by the plurality of second electrodes. Moreover, since there is a gap region between the plurality of second electrodes, transmittance of the photosensitive region of the display substrate is effectively improved, thereby improving the photosensitive effect of the sensor.

Figure 6:
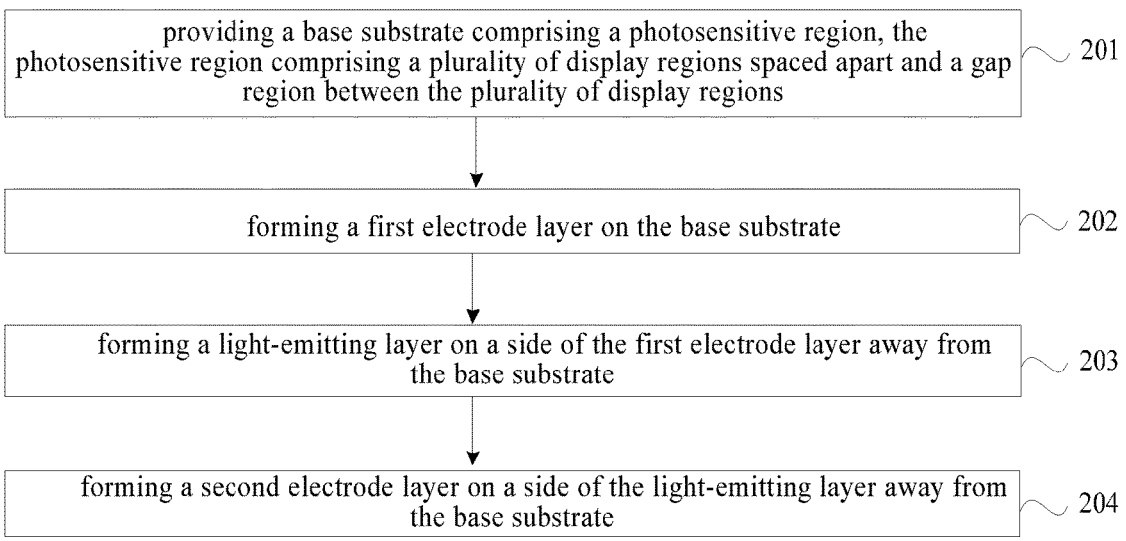
FIG. 6 is a flowchart of a method for fabricating a display substrate according to an embodiment of the present disclosure.

FIG. 6 is a flowchart of a method for fabricating a display substrate according to an embodiment of the present disclosure. The method can be used to fabricate a display substrate as shown in FIGS. 1-4, and the method may include: step 201: providing a base substrate 110 including a photosensitive region 100, the photosensitive region 100 including a plurality of display regions 101 spaced apart and a gap region 102 between the plurality of display regions; step 202: forming a first electrode layer 120 on the base substrate 110; step 203: forming a light-emitting layer 130 on a side of the first electrode layer 120 away from the base substrate 110; step 204: forming a second electrode layer 140 on a side of the light-emitting layer 130 away from the base substrate. The light-emitting layer 130 includes a plurality of first luminescent material regions 131 and a plurality of second luminescent material regions 132; each display region 101 corresponds to at least one first luminescent material region 131; the gap region 102 corresponds to the plurality of second luminescent material regions 132; a part of the second electrode layer 140 in the photosensitive region 100 includes a plurality of second electrodes 141 spaced apart, and an orthographic projection of each second electrode 141 on the base substrate overlaps with each display region 101.

In the embodiments of the present disclosure, the first electrode layer 120 may be formed on the base substrate 110 by a patterning process. The first electrode layer 120 may be made of an indium tin oxide (ITO) material, and the first electrode layer 120 may be an anode. The plurality of second electrodes 141 may be made of a material such as ITO or silver, and each second electrode may be a cathode. The light-emitting layer 130 may be made of an organic luminescent material.

In summary, embodiments of the present disclosure provide a method for fabricating a display substrate. A first electrode layer is formed on a base substrate, and a light-emitting layer is formed on a side of the first electrode layer away from the base substrate, a second electrode layer is formed on a side of the light-emitting layer away from the base substrate. A part of the second electrode layer in the photosensitive region includes a plurality of second electrodes spaced apart. Since there is a gap region between the plurality of second electrodes, the transmittance of the photosensitive region of the display substrate is effectively improved, thereby improving the photosensitive effect of the sensor.

Figure 7:
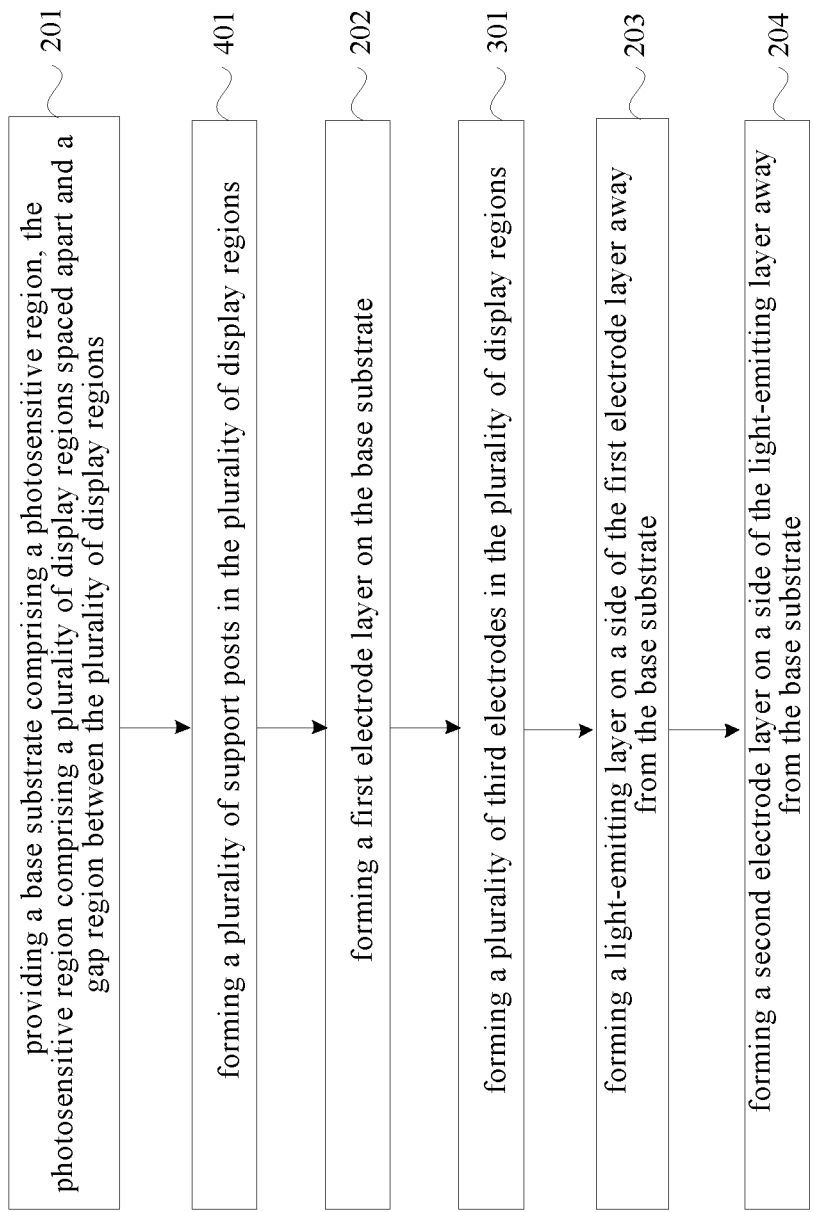
FIG. 7 is a flowchart of a method for fabricating a display substrate according to an embodiment of the present disclosure.

In some embodiments, as shown in FIG. 7, before forming the light-emitting layer 130 on the side of the first electrode layer 120 away from the base substrate 110, the method may further include: step 301: forming a plurality of third electrodes 150 in the plurality of display regions 101. A top of each third electrode 150 is higher than a top of the light-emitting layer 130 in a direction perpendicular to the base substrate 110, and each second electrode 140 is in connection with a part of each third electrode 150 higher than the light-emitting layer 130.

In some embodiments, as shown in FIG. 7, before forming the first electrode layer 120 on the base substrate 110, the method further includes: step 401: forming a plurality of support posts 151 in the plurality of display regions 101, the plurality of support posts 151 being in one-to-one correspondence with the plurality of third electrodes 150. The step of forming the plurality of third electrodes 150 in the plurality of display regions 101 includes: forming each of the plurality of third electrodes 150 on a top surface and a side surface of each of the plurality of support posts 151.

In the embodiments of the present disclosure, the plurality of support posts 151 may be formed spaced apart in the photosensitive region 100 of the base substrate 110 by using one patterning process. The patterning process may include steps of depositing a film layer, photoresist coating, exposing, developing, etching, and photoresist stripping.

In the embodiments of the present disclosure, the support posts 151 and the planarization layer 160 may be integrated. The plurality of support posts 150 and the planarization layer 160 may be formed by one patterning process. Alternatively, the planarization layer 160 may be formed on the base substrate 110 first, and then the plurality of support posts 151 may be formed on a side of the planarization layer 160 away from the base substrate 110, which is not limited in the embodiments of the present disclosure. Optionally, the plurality of support posts 151 and the planarization layer 160 may be made of a resin material.

Optionally, each support post may be a cylinder or a polygonal prism, such as a quadrangular prism, a hexagonal prism, or an octagonal prism.

Optionally, each support post may be a truncated cone or a truncated pyramid. For example, as shown in FIG. 5, an angle θ between a side surface of the support post 151 and a side of the planarization layer 160 away from the base substrate 110 may be an acute angle. For example, the angle θ can range from 5 degrees to 85 degrees. In this case, a part of the third electrode 150 covering the side surface of the support post 151 is also at an angle θ with the planarization layer 160. When the second electrodes are formed, the contact region between the third electrode 150 and the second electrode 141 can be increased, which facilitates a formation of a better electrical connection.

Figure 8:
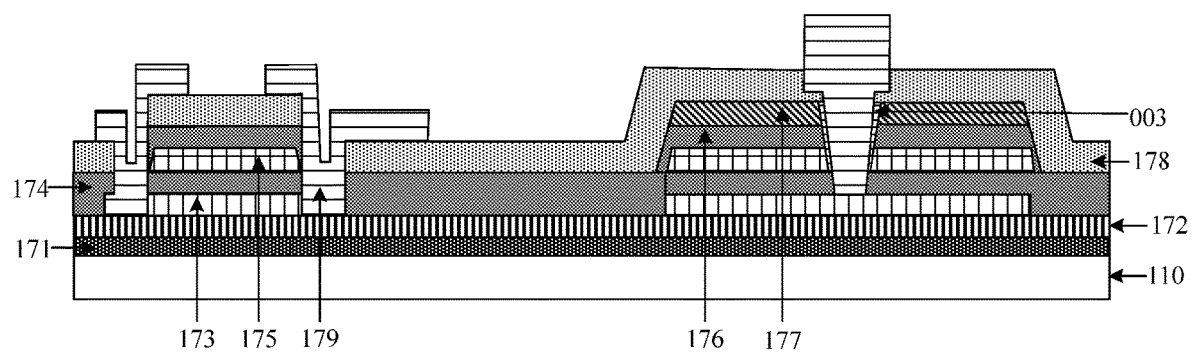
FIG. 8 is a schematic diagram of a base substrate provided with a plurality of film layers according to an embodiment of the present disclosure.
Figure 9:
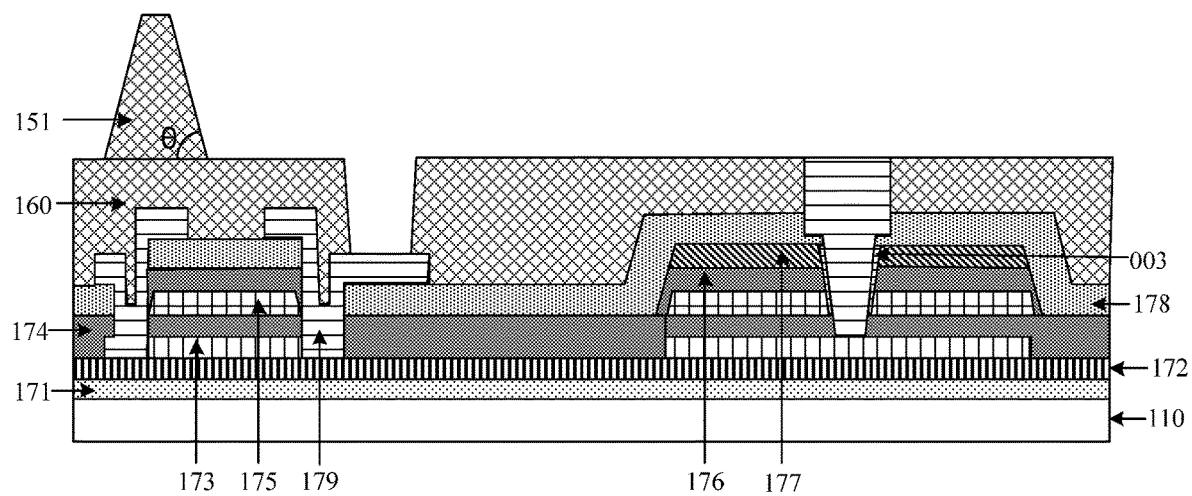
FIG. 9 is a schematic diagram of a base substrate provided with a planarization layer and a support post according to an embodiment of the present disclosure.

In the embodiments of the present disclosure, before the plurality of support posts 151 are formed in the photosensitive region 100 of the base substrate 110, a PI film 171, a buffer layer 172, an active layer 173, a first insulating layer 174, a first gate layer 175, a second insulating layer 176, a second gate layer 177, a interlayer dielectric layer 178, and a source/drain layers 179 may be sequentially formed on the base substrate 110. For example, the buffer layer 172 may be made of silicon nitride. The active layer 173 may be made of p-type silicon (p-Si). The first gate layer 175, the second gate layer 177, and the source/drain layer 179 may be made of a conductive material. The source/drain layer 179 may be connected to the active layer 173 through a via 003. A schematic diagram of the base substrate 110 provide with the PI film 171, the buffer layer 172, the active layer 173, the first insulating layer 174, the first gate layer 175, the second insulating layer 176, the second gate layer 177, the interlayer dielectric layer 178, and the source/drain layer 179 can be referred to FIG. 8. A schematic diagram of the base substrate 110 provided with the planarization layer 160 and the support post 151 can be referred to FIG. 9.

In the embodiments of the present disclosure, the plurality of support posts can support a package glass, so original support structures in the display substrate can be omitted. Meanwhile, since the plurality of support posts are higher than the light-emitting layer, in the process of evaporating the light-emitting layer with a mask, the distance between the mask and the light-emitting layer will not be too small, and damage to the light-emitting layer of the display substrate during the mask evaporation can be avoided.

Figure 10:
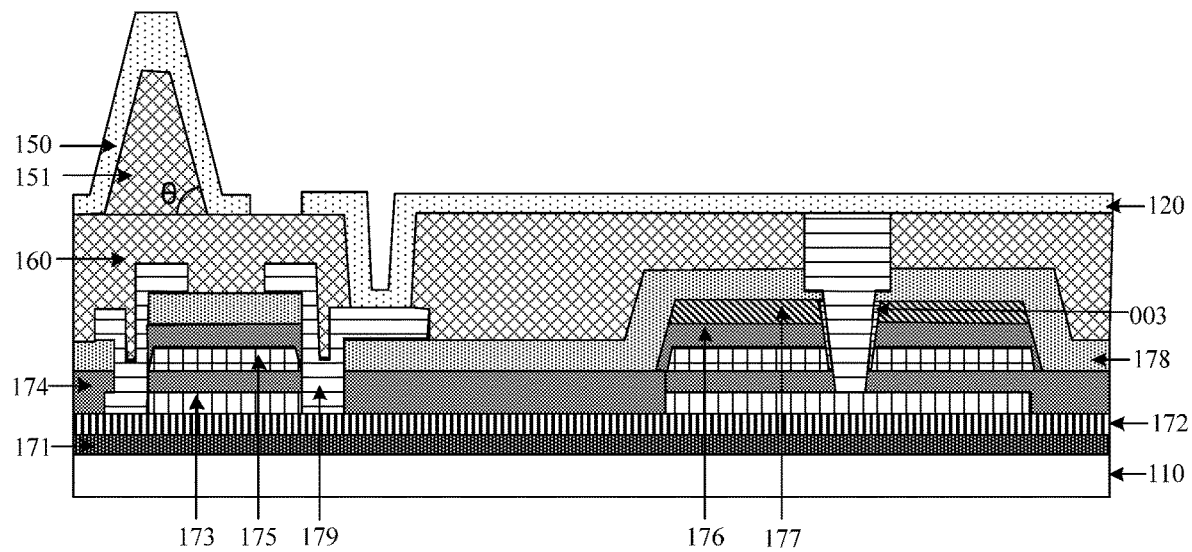
FIG. 10 is a schematic diagram of a base substrate provided with a first electrode layer and a third electrode according to an embodiment of the present disclosure.

Optionally, the plurality of third electrodes and the first electrode layer may be formed by one patterning process. Alternatively, the first electrode layer and the plurality of third electrodes may be formed on the base substrate by different patterning processes. The plurality of third electrodes may be made of a material such as ITO or silver. A schematic diagram of the base substrate 110 provided with the first electrode layer 120 and the third electrode 150 can be referred to FIG. 10.

Figure 11:
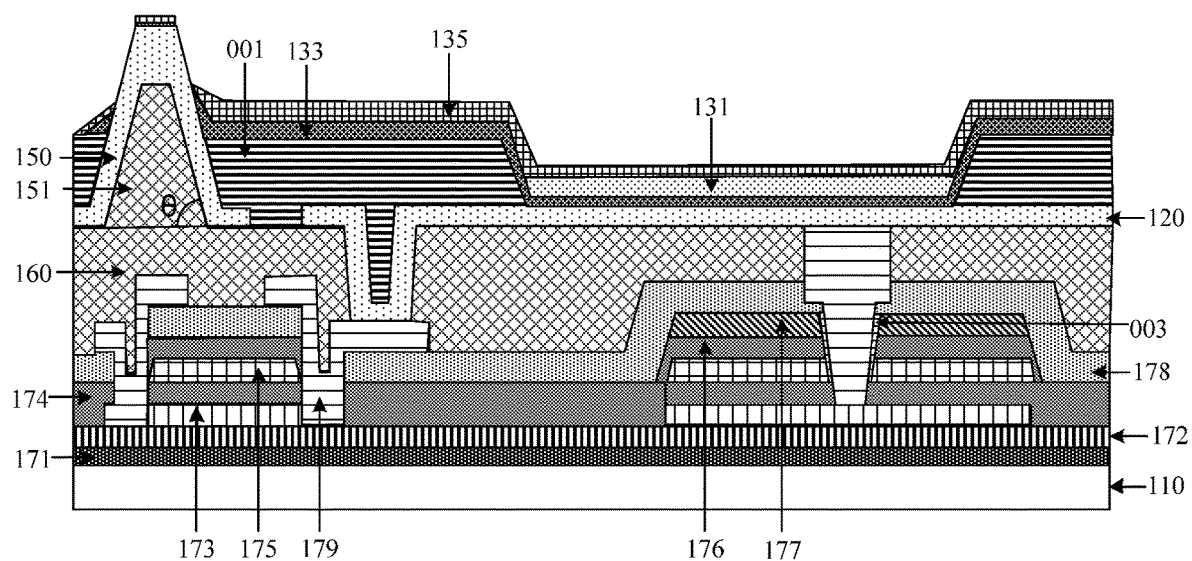
FIG. 11 is a schematic diagram of a base substrate provided with a light-emitting layer according to an embodiment of the present disclosure.

Optionally, the pixel defining layer 001 may be formed on a side of the first electrode layer 120 away from the base substrate 110, then the hole transport layer 133 may be formed on a side of the pixel defining layer 001 away from the base substrate 110, then the light-emitting layer 130 may be formed on a side of the hole transport layer 133 away from the base substrate 110 by evaporation, and finally, the electron transport layer 135 is formed on a side of the light-emitting layer away from the base substrate 110. The part of the light-emitting layer in the display region may include the plurality of first luminescent material regions 131 spaced apart, and the top of each third electrode 150 is higher than the top of the light-emitting layer. The gap region may be provided with the plurality of second luminescent material regions, or may not be provided with the second luminescent material region. A schematic diagram of the base substrate 110 provided with the light-emitting layer can be referred to FIG. 11.

Optionally, the second electrode layer 140 may be evaporated on the side of the light-emitting layer away from the base substrate 110 with a fine metal mask. The part of the second electrode layer in the photosensitive region may include the plurality of second electrodes 141. A schematic diagram of the base substrate 110 provided with the second electrode 141 in the photosensitive region can be referred to FIG. 5.

It should be noted that the sequence of the steps of the method for fabricating the display substrate provided by the embodiments of the present disclosure may be adjusted, and the steps may also be added or omitted according to actual requirements. Any method that can be easily conceived by those skilled in the art within the scope of the present disclosure is intended to be included in the scope of the present disclosure, and therefore will not be described again.

In summary, embodiments of the present disclosure provide a method for fabricating a display substrate. A first electrode layer is formed on a base substrate, and a light-emitting layer is formed on a side of the first electrode layer away from the base substrate, a second electrode layer is formed on a side of the light-emitting layer away from the base substrate. A part of the second electrode layer in the photosensitive region includes a plurality of second electrodes spaced apart, each second electrode is in connection with a side surface of a part of each third electrode higher than the light-emitting layer, thus a power signal provided by a driving circuit can be transmitted to the corresponding second electrode through the third electrode. Then the second electrode, together with the first electrode layer, can drive the first luminescent material region to emit light. The display substrate provided by the embodiments of the present disclosure can transmit the power signal to the plurality of second electrodes spaced apart through the plurality of third electrodes, ensuring the plurality of first luminescent material regions can be normally driven by the plurality of second electrodes. Moreover, since there is a gap region between the plurality of second electrodes, transmittance of the photosensitive region of the display substrate is effectively improved, thereby improving the photosensitive effect of the sensor.

Embodiments of the present disclosure further provides a display device, the display device includes a display substrate as described above, and further includes an optical sensor on a side of the base substrate facing away from the light-emitting layer. The optical sensor corresponds to the photosensitive region.

The display device can be any product or component having a display function such as an electronic paper, a mobile phone, a tablet computer, a television, a display, a notebook computer, a digital photo frame, a navigator.

The above embodiments are only used for explanations rather than limitations to the present disclosure. Any modifications, equivalents, improvements within the spirit and scope of the present disclosure pertain to the protection scope of the disclosure.

The invention claimed is:

1. A display substrate comprising:
 a base substrate comprising a photosensitive region, the photosensitive region comprising a plurality of display regions spaced apart and a gap region between the plurality of display regions;
 a first electrode layer on the base substrate;
 a light-emitting layer on a side of the first electrode layer away from the base substrate; and
 a second electrode layer on a side of the light-emitting layer away from the base substrate;
 wherein the light-emitting layer comprises a plurality of first luminescent material regions and a plurality of second luminescent material regions;
 wherein each display region corresponds to at least one first luminescent material region;
 wherein the gap region corresponds to the plurality of second luminescent material regions;
 wherein a portion of the second electrode layer in the photosensitive region comprises a plurality of second electrodes spaced apart from each other and an orthographic projection of each second electrode on the base substrate overlaps with each display region.

2. The display substrate of claim 1, further comprising:
 a plurality of third electrodes, each third electrode being arranged in one of the plurality of display regions;
 wherein a top of each third electrode is higher than a top of the light-emitting layer in a direction perpendicular to the base substrate; and
 wherein each second electrode is in connection with a portion of each third electrode that is higher than the light-emitting layer.

3. The display substrate of claim 2, further comprising:
 a plurality of support posts in the plurality of display regions;
 wherein the plurality of support posts are arranged in a one-to-one correspondence with the plurality of third electrodes; and
 wherein each third electrode covers a top surface and a side surface of a corresponding support post of the plurality of support posts.

4. The display substrate of claim 3, wherein each support post is a cylinder or a polygonal prism.

5. The display substrate of claim 3, wherein each support post is a truncated cone or a truncated pyramid; and
 wherein an angle between a side surface and a bottom surface of each support post is about 5 degrees to about 85 degrees.

6. The display substrate of claim 3, further comprising:
 a planarization layer between the base substrate and the first electrode layer;
 wherein the plurality of support posts and the planarization layer are integrated.

7. The display substrate of claim 1, further comprising:
 a non-photosensitive region;
 wherein a part of the light-emitting layer in the non-photosensitive region comprises a plurality of third luminescent material regions, a part of the second electrode layer in the non-photosensitive region comprises a sheet electrode, and an orthographic projection of the sheet electrode on the base substrate covers orthographic projections of the plurality of third luminescent material regions on the base substrate.

8. The display substrate of claim 7, wherein a size of each first luminescent material region in the display region is smaller than a size of each third luminescent material region in the non-photosensitive region.

9. A method for fabricating the display substrate of claim 1, comprising:
 providing a base substrate comprising a photosensitive region, the photosensitive region comprising a plurality of display regions spaced apart and a gap region between the plurality of display regions;
 forming a first electrode layer on the base substrate;
 forming a light-emitting layer on a side of the first electrode layer away from the base substrate; and
 forming a second electrode layer on a side of the light-emitting layer away from the base substrate;
 wherein the light-emitting layer comprises a plurality of first luminescent material regions and a plurality of second luminescent material regions; each display region corresponds to at least one first luminescent material region; the gap region corresponds to the plurality of second luminescent material region; a part of the second electrode layer in the photosensitive region comprises a plurality of second electrodes spaced apart, and an orthographic projection of each second electrode on the base substrate overlaps with each display region.

10. The method of claim 9, further comprising:
 forming a plurality of third electrodes in the plurality of display regions before forming the light-emitting layer on the side of the first electrode layer away from the base substrate;
 wherein a top of each third electrode is higher than a top of the light-emitting layer in a direction perpendicular to the base substrate, and each second electrode is in connection with a part of each third electrode higher than the light-emitting layer.

11. The method of claim 10, further comprising:
 forming a plurality of support posts before forming the first electrode layer on the base substrate, the plurality of support posts being in one-to-one correspondence with the plurality of third electrodes;
 wherein forming the plurality of third electrodes in the plurality of display regions comprises:
 forming each of the plurality of third electrodes on a top surface and a side surface of each of the plurality of support posts.

12. A display device comprising a display substrate, wherein the display substrate comprises:
 a base substrate comprising a photosensitive region, the photosensitive region comprising a plurality of display regions spaced apart and a gap region between the plurality of display regions;
 a first electrode layer on the base substrate;
 a light-emitting layer on a side of the first electrode layer away from the base substrate; and
 a second electrode layer on a side of a light-emitting layer away from the base substrate;
 wherein the light-emitting layer comprises a plurality of first luminescent material regions and a plurality of second luminescent material regions;
 wherein each display region corresponds to at least one first luminescent material region;
 wherein the gap region corresponds to the plurality of second luminescent material regions;

wherein a portion of the second electrode layer in the photosensitive region comprises a plurality of second electrodes spaced apart from each other and an orthographic projection of each second electrode on the base substrate overlaps with each display region.

13. The display device of claim 12, further comprising:
a plurality of third electrodes, each third electrode being arranged in one of the plurality of display regions;
wherein a top of each third electrode is higher than a top of the light-emitting layer in a direction perpendicular to the base substrate; and
wherein each second electrode is in connection with a portion of each third electrode that is higher than the light-emitting layer.

14. The display device of claim 13, further comprising:
a plurality of support posts in the plurality of display regions;
wherein the plurality of support posts are arranged in a one-to-one correspondence with the plurality of third electrodes; and
wherein each third electrode covers a top surface and a side surface of a corresponding support post of the plurality of support posts.

15. A display device of claim 14, wherein each support post is a cylinder or a polygonal prism.

16. The display device of claim 14, wherein each support post is a truncated cone or a truncated pyramid; and wherein an angle between a side surface and a bottom surface of each support post is about 5 degrees to about 85 degrees.

17. The display device of claim 14, further comprising:
a planarization layer between the base substrate and the first electrode layer;
wherein the plurality of support posts and the planarization layer are integrated.

18. The display device of claim 12, further comprising:
a non-photosensitive region;
wherein a portion of the light-emitting layer in the non-photosensitive region comprises a plurality of third luminescent material regions;
wherein a portion of the second electrode layer in the non-photosensitive region comprises a sheet electrode; and
wherein an orthographic projection of the sheet electrode on the base substrate covers orthographic projections of the plurality of third luminescent material regions on the base substrate.

19. The display device of claim 18, wherein an area of each first luminescent material region in the display region is smaller than an area of each third luminescent material region in the non-photosensitive region.

* * * * *